Oct. 24, 1972 B. W. KENNEDY 3,700,538

POLYIMIDE RESIN-FIBERGLASS CLOTH LAMINATES
FOR PRINTED CIRCUIT BOARDS
Filed Sept. 10, 1970

BOBBY W. KENNEDY
*INVENTOR*

BY

Joseph H. Beumer
*ATTORNEYS*

United States Patent Office 3,700,538

Patented Oct. 24, 1972

3,700,538

POLYIMIDE RESIN-FIBERGLASS CLOTH LAMINATES FOR PRINTED CIRCUIT BOARDS

Bobby W. Kennedy, Arab, Ala., assignor to the United States of America as represented by the Administrator of the National Aeronautics and Space Administration Filed Sept. 10, 1970, Ser. No. 71,048
Int. Cl. B32b *15/08, 15/14, 31/26*
U.S. Cl. 161—93 6 Claims

ABSTRACT OF THE DISCLOSURE

Nonflammable printed circuit board laminates having a low coefficient of thermal expansion in the thickness direction are made of multiple plies of polyimide-resin-impregnated fiberglass cloth. A stacked array of resin-impregnated cloth sheets is heated under pressure to B-stage curing temperature, and the resulting laminate is post cured by further heating in air. Copper cladding is applied by placing adhesive-coated foil in contact with the laminate before or after B-stage curing. Further control of thermal and electrical properties of the laminate is realized by use of a finely divided inorganic filler such as silica or calcium silicate.

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

This invention relates to printed circuit boards and more particularly to laminated base material for printed circuit boards and to a method of preparing the same.

Printed circuits boards are widely used for electronic assemblies in the aerospace field where such factors as minimum weight and close control over performance characteristics are of critical importance. Printed circuit boards provide for interconnection of electronic components by means of conductive circuit paths positioned in a predetermined pattern on an insulating base member. Electronic components are normally joined to circuit paths by soldering of component leads which extend through plated holes in the base member to the circuit paths.

A recurrent problem in the manufacture of circuit board assemblies, and a major cause of failure in service, has been a tendency of solder fillets to develop cracks. The formation of cracks results primarily from differential thermal expansion properties of the insulating base member and metallic materials used for solder, plating and component leads at the joint area. For example, a widely used epoxy-resin-impregnated fiberglass insulating board has a thermal expansion coefficient in the thickness plane of $51\times10^{-6}$ cm./cm./° C., as compared to 15 to $17\times10^{-6}$ cm./cm./° C. for the solder, plating and component lead mounted on the board. It may be readily seen that this threefold difference in thermal expansion creates severe crack-producing stresses whenever the circuit board is subjected to substantial variations in temperature. For certain space applications a wide range of temperature service capability, typically from −65° C. to 200° C., is required owing to the extreme conditions encountered in the space environment. The previously known circuit board materials do not provide a high assurance of reliability over such a range of temperatures.

Another deficiency of previously known circuit board materials is that boards impregnated with epoxy resins and most of the other resins which have been used as a constituent of the insulating member will burn to some extent in air and very rapidly in a high-oxygen atmosphere. For space vehicle use involving service in a pure oxygen environment nonflammability is required to preclude rapid spread of any electrical fire. Other space applications involve service under vacuum conditions in proximity to optical equipment or other devices which would be degraded by deposition of a coating derived from vacuum outgassing products. For such applications the circuit board laminate should be characterized by minimum outgassing in vacuum.

Further requirements for circuit board laminates include suitable mechanical properties, in particular, high strength and rigidity, and favorable insulating characteristics. Maximum thermal conductivity consistent with the above properties is also desired in order to dissipate the heat generated by electrical components. Fabrication of laminates normally includes application of a copper cladding on one or both sides, and the laminate must be amenable to secure bonding or adhesion of cladding.

SUMMARY OF THE INVENTION

In the present invention a circuit board laminate is made of multiple plies of fiberglass cloth impregnated with polyimide resin. The laminate is prepared by impregnating individual sheets of fiberglass cloth, stacking to the desired thickness, heating to B-stage curing temperature under pressure, and heating to final curing temperature in air. Copper cladding is applied to one or both sides of the laminate by placing adhesive-coated foil in contact with the assembly before or after B-stage curing. A finely divided inorganic material such as silica or calcium silicate is used in another embodiment of the invention for further control of thermal and electrical properties. The resulting polyimide-fiberglass laminate exhibits a low coefficient of thermal expansion, substantially the same in the thickness plane as metal solder, platings and component leads, so that the problem of solder cracking due to differential thermal expansion is alleviated. In addition laminate material embodying the invention is nonflammable in pure oxygen and it undergoes little or no outgassing in vacuum. Other requirements for circuit board laminates including high strength and rigidity and suitable electrical insulating characteristics are also met. The invention also includes application to the laminate of a strongly adhering copper cladding.

It is therefore an object of this invention to provide an insulating laminate for printed circuit boards which has a low coefficient of thermal expansion in the thickness plane.

Another object is to provide a printed circuit board assembly resistant to cracking of solder connections upon being subjected to thermal cycling.

Still another object is to provide a circuit board laminate that is nonflammable in a pure oxygen atmosphere.

Yet another object is to provide a circuit board laminate characterized by minimum outgassing in vacuum.

Another object is to provide a method of preparing copper-clad, polyimide-resin-impregnated circuit board laminates.

Other objects and advantages of the invention will be apparent from the following detailed descriptions and the appended claims.

DESCRIPTION OF THE PREFERRED EMBODIMENT

Figure 1:
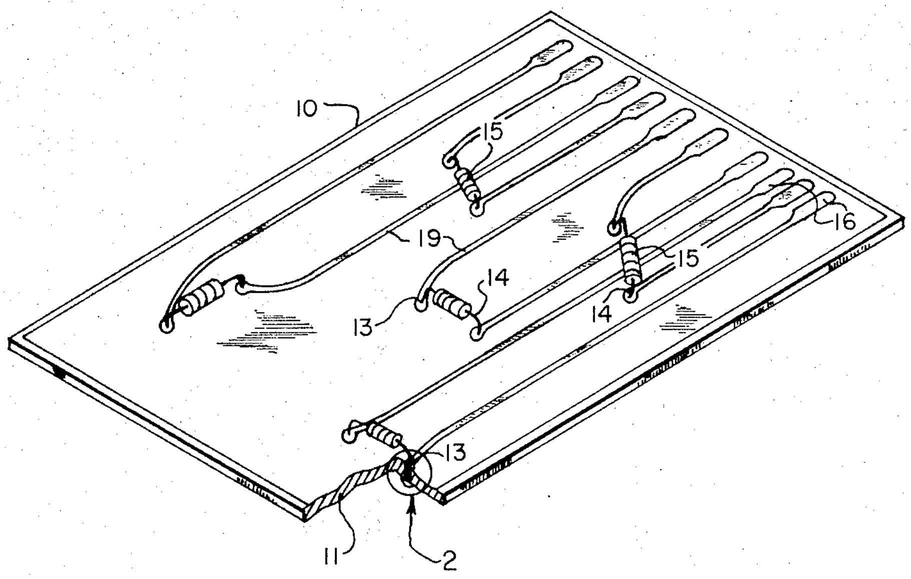
FIG. 1 is a perspective view, partially broken away, of a printed circuit board assembly embodying the invention.

Referring to FIG. 1 of the drawings a circuit board assembly is indicated by numeral 10. The laminated base member 11 is made up of multiple plies of polyimide-resin-impregnated fiberglass cloth. Copper circuit paths 19 corresponding to a predetermined circuit pattern are disposed on the base member 11. Each of the circuit paths has a plated hole 13 near its outer end extending through the base member 11 for mounting of a metallic lead 14 of an electronic component 15 such as a transistor. The circuit paths 19 have widened portions 16 in spaced-apart alinement near one edge of the base member for engagement with a mating connector (not shown).

Figure 2:
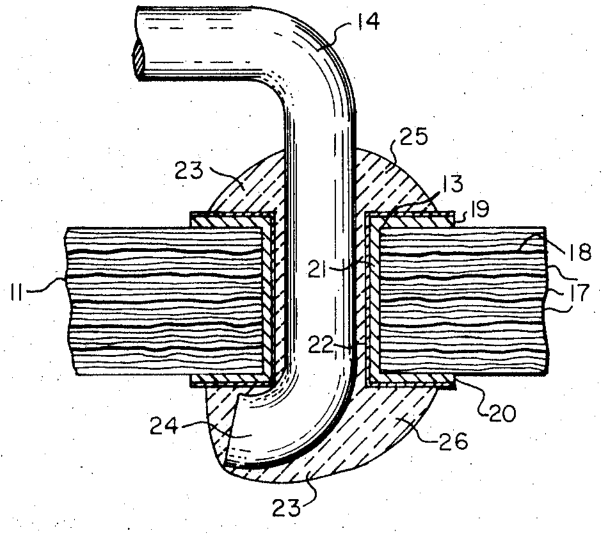
FIG. 2 is an enlarged sectional view of the encircled area indicated as by the numeral 2 in FIG. 1.

FIG. 2 shows structural details at the juncture of component lead 14 with the base member 11. In this view six woven fiberglass cloth layers 17 can be seen in the base member cross-section, with the space between and around the layers being filled with polyimide resin 18. The base member 11 has top and bottom copper circuit paths 19 and 20, the copper having been applied as a cladding and selectively removed except at circuit path locations. Hole 13 is plated through with a copper plating 21, and circuit paths 19 and 20 and plating 21 are in turn covered with a thin gold plating 22. Solder 23 is deposited around component lead 14 at its juncture with plated hole 13 and circuit paths 19 and 20. Component lead 14 has an end portion 24 which has been crimped over for secure attachment to base member 11. The most critical areas of the solder joint are the top and bottom fillets 25 and 26 where cracks would develop during thermal cycling if the base member 11 and the metallic components including component lead 14, solder and platings were to expand and contract at substantially different rates.

Although any woven fiberglass cloth can be used for the laminated base member, it is preferred to use close woven cloth incorporating fibers woven in the thickness direction in addition to a conventional cross weave. A three-dimensional woven structure contributes to the attainment of isotropic thermal expansion properties in the laminated board. An example of suitable fiberglass cloth is that available commercially under the designation "Tricon," which is an extra heavy woven cloth reinforced with glass roving and which has a nominal thickness of 0.85 to 0.110 inch. Another suitable material is "Tricon HS–1" three-dimensional woven fiberglass cloth which incorporates up to forty percent by weight quartz fibers in the fill direction of the fabric. Although not critical, best results are obtained by using fiberglass cloth that has been heat cleaned or finished by treatment with an aminosilane or methylacrylato chromic chloride, the latter treatment being designated as "Volan" finishing.

The polyimide resin component can be any polyimide resin, which material is produced by condensation of a dianhydride such as pyromellitimide dianhydride with a diamine such as metaphenylene diamine, 4,4′-diaminodiphenylether or benzidine. A suitable polyimide resin is a heat-reactive resin available commercially under the designation "Skybond," which resin has the following properties: solids content, 60 to 64 percent; viscosity, 2500 to 7000 centipoises; pH 4.0–4.7; and specific gravity, 1.15–1.18. An organic solvent such as N-methyl pyrrolidone, toluene, xylene, methyl Cellosolve or ethanol can be used if needed to dilute the polyimide resin and provide effective impregnation of the fiberglass cloth.

The properties sought to be obtained in the laminated base member, in particular, low thermal expansion and nonflammability are favored by use of the minimum possible amount of resin in comparison with the fiberglass cloth. However, the amount of resin must not be reduced below that at which the fiber yarns are incompletely wetted or the interstices in the weave are not saturated, inasmuch as voids and structurally weak areas would result. In general best results are obtained by incorporating 10 to 15 volume percent resin in the cured laminate, the balance being fiberglass cloth.

The fiberglass cloth is impregnated with the polyimide resin, preferably by placing the cloth in contact with the resin under a vacuum such as 30 inches of mercury. The resin can also be applied by means of spraying or immersion.

The resin-impregnated cloth is then stacked to the desired thickness in suitable apparatus for application of heat and pressure. For most applications a minimum of six plies of impregnated cloth is used to obtain a strong, rigid structure having the properties discussed above. The number of layers will also depend on the final thickness desired, which is normally $\frac{1}{16}$ to $\frac{1}{8}$ inch. It is preferred to use a multiple cavity stainless steel mold for forming the laminate, the mold having vents to allow offgases to escape and thus prevent formation of voids or bubbles. A conventional platen-type press can be used to apply pressure.

Lamination is accomplished by heating the stacked cloth to B-stage curing temperature, which can be from 600° F. to 650° F. while applying a pressure of 140 to 250 pounds per square inch. A preferred curing cycle is as follows: "kiss" contact for 90 seconds at 10 to 25 p.s.i., "bump" contact for 90 seconds at 10 to 25 p.s.i., dwell for 30 minutes at 600° F. and 140 p.s.i., cool down to 500° F. in air at 140 p.s.i. and cool down to ambient temperature with cold water at 140 p.s.i.

The resulting laminate is then post-cured by heating in air in order to remove any remaining moisture and volatile material such as solvents. Holding at a temperature of 600° F. to 700° F. for a period of at least one hour, and preferably about 16 hours gives best results.

Copper cladding, and preferably a two ounce copper foil treated with a mercaptosilane coupling agent and baked at 150° C. for fifteen minutes, is applied to the laminate to produce a structure suitable for circuit board fabrication. The copper foil is joined to the laminate by means of adhesive bonding under heat and pressure. A polyimide resin such as is used for impregnating the fiberglass cloth can be used for bonding of the foil. Adhesive coated foil can be joined to the laminate during the B-stage curing process by placing foil on one or both sides thereof and following the curing cycle given above. Alternately, the laminate can be B-stage cured separately and the adhesive-coated foil applied to the laminate, after which the B-stage curing cycle of heating under pressure is repeated.

In other embodiments of the invention finely divided additives can be incorporated in the laminate in order to provide further control over the thermal conductivity and expansion properties and to improve adhesion of the copper cladding. Silica, calcium silicate or colloidal alumina at a proportion up to one weight percent, and preferably about 0.5 weight percent, provides increased thermal conductivity and decreased thermal expansion. Finely ground glass frit or micropulverized glass fibers at a proportion up to two weight percent, and preferably about one weight percent, serve to increase the peel strength of the bond between the laminate and copper cladding. Any of these additives can be incorporated in the laminate by mixing the additive in finely divided form with the polyimide resin prior to impregnation of the cloth.

Copper-clad laminated boards prepared as described above are suitable for use in fabrication of printed circuit board assemblies by means of conventional techniques. In a typical procedure a pattern corresponding to the desired circuit paths is printed on the clad board. After coating with a photoresist the copper between circuit paths is removed by etching. Holes are cut in the required locations and plated through with copper. A thin plating of gold is then applied to the circuit paths and hole plating to provide additional protection from deterioration. Electronic components are mounted by insertion and crimping of leads, and solder joints are formed at the junctures of leads and circuit paths. Various other operations such as conformal coating or solder coating can also be employed.

Laminated board test specimens prepared in accordance with this invention show a coefficient of thermal expansion of 15 to $17\times10^{-6}$ cm./cm./° C. in the thickness direction and 6 to $13\times10^{-6}$ cm./cm./° C. in the warp and fill directions. Using a standard test for determination of flammability in pure gaseous oxygen, test specimens do not ignite under oxygen pressures up to 14 atmospheres. Other properties which have been determined include: Barcol hardness, 97; flexural strength, $52.3\times10^3$ p.s.i.; flexural modulus $3.12\times10^6$ p.s.i.; tensile strength, $46.9\times10^3$ p.s.i.; modulus of elasticity, $2.96\times10^6$; peel strength of ⅛ inch wide strip, 6.9 p.s.i.; dielectric strength, 179 volts/mil; dielectric constant (1 mHz.) 4.10; dissipation factor (1 mHz.), .0044; insulation resistance (megohms), $2\times10^7$; volume resistivity, $2.5\times10^{15}$ ohms/cm.$^3$; surface resistivity $3.3\times10^{14}$ ohms; and water absorption (24 hours immersion), 0.70 percent.

It is to be understood that various changes and modifications in the materials, procedures and techniques described above can be employed by one skilled in the art without departing from the spirit and scope of the invention.

What is claimed is:

1. The method of preparing a foil-clad, nonflammable circuit board characterized by a low coefficient of thermal expansion in the thickness direction which comprises impregnating fiberglass cloth with an amount of polyimide resin sufficient to provide a content of said resin from about 10 to 15 volume percent in said board, forming sheets of said impregnated cloth into a stacked array, compressing said array at a pressure of at least 140 pounds per square inch, heating said array while under pressure at a temperature of 600° F. to 650° F. whereby a B-stage cured laminate is formed, adhesively bonding a sheet of copper foil to at least one side of the resulting laminate and heating the resulting clad laminate to a temperature of about 600° F. to 700° F. in an oxidizing atmosphere for at least one hour.

2. The method of claim 1 wherein copper foil coated with a polyimide adhesive is placed in contact with said array prior to application of heat and pressure.

3. The mehod of claim 1 wherein said pressure is 140 to 250 pounds per square inch.

4. A circuit board prepared by impregnating fiberglass cloth with polyimide resin in an amount sufficient to provide a resin content of about 10 to 15 volume percent in the resulting board, forming sheets of said impregnated cloth into a stacked array, compressing said array at a pressure of about 140 to 250 pounds per square inch, heating said array while under pressure at a temperature of 600° F. to 650° F., adhesively bonding a sheet of copper foil to at least one side of the resulting laminate and heating the clad laminate to a temperature of about 600° F. to 700° F. in an oxidizing atmosphere for at least one hour.

5. The circuit board of claim 4 including about one-half to one weight percent of a finely divided additive selected from the group consisting of silica, calcium silicate and colloidal alumina incorporated in said polyimide resin.

6. The circuit board of claim 4 including about one to two weight percent finely divided glass frit or micropulverized glass fibers incorporated in said polyimide resin.

References Cited

UNITED STATES PATENTS

| | | | |
|---|---|---|---|
| 3,247,165 | 4/1966 | Rodia | 260—65 |
| 3,473,992 | 10/1969 | Martello et al. | 161—93 X |
| 3,416,994 | 12/1968 | Chalmers et al. | 161—227 |
| 3,053,929 | 9/1962 | Friedman | 156—8 X |
| 3,393,117 | 7/1968 | Zolg et al. | 161—93 X |
| 3,473,993 | 10/1969 | Kepple et al. | 161—93 X |
| 3,499,220 | 3/1970 | Hintz et al. | 174—68.5 X |
| 3,508,984 | 4/1970 | Travis | 156—3 |

WILLIAM A. POWELL, Primary Examiner

U.S. Cl. X.R.

156—3, 8, 228, 313, 331; 161—162, 196, 197, 214, 227, 403; 174—68.5